US005569321A

United States Patent [19]

Takita et al.

[11] Patent Number: 5,569,321

[45] Date of Patent: Oct. 29, 1996

[54] PRE-TREATING SOLUTION FOR ELECTROLESS PLATING

[75] Inventors: Takao Takita, Yuki; Takeshi Sakai, Tsukuba; Takeshi Shimazaki, Yuki, all of Japan

[73] Assignee: Hitachi Chemical Company, Ltd., Tokyo, Japan

[21] Appl. No.: 225,316

[22] Filed: Apr. 8, 1994

[30] Foreign Application Priority Data

Apr. 9, 1993 [JP] Japan .................................. 5-083145

[51] Int. Cl.$^6$ .................................................. C23C 18/00
[52] U.S. Cl. .......................................... 106/1.05; 106/1.11
[58] Field of Search .................................... 106/1.05, 1.11

[56] References Cited

U.S. PATENT DOCUMENTS

| | | | |
|---|---|---|---|
| 4,001,470 | 1/1977 | Schulze-Berge | 106/1.11 |
| 4,181,750 | 1/1980 | Beckenbaugh et al. | 427/98 |
| 4,182,784 | 1/1980 | Krulik | 106/1.11 |
| 4,863,758 | 9/1989 | Rhodenizer | 106/1.11 |
| 5,206,052 | 4/1993 | Nakaso et al. | 427/98 |
| 5,254,156 | 10/1993 | Nakaso et al. | 106/1.11 |

FOREIGN PATENT DOCUMENTS

| | | |
|---|---|---|
| 50-74 | 1/1975 | Japan . |
| 50-81927 | 7/1975 | Japan . |
| 54-62930 | 5/1979 | Japan . |
| 59-49305 | 12/1984 | Japan . |

*Primary Examiner*—Helene Klemanski
*Attorney, Agent, or Firm*—Antonelli, Terry, Stout & Kraus

[57] ABSTRACT

A pretreating solution for electroless plating comprising sulfuric acid, a halide, an organic acid and water as a diluent functions as an adhesion accelerating agent without generating etching corrosion, has a long life and provides excellent adhesiveness of plated copper to both glass cloth and substrate resins.

2 Claims, No Drawings

PRE-TREATING SOLUTION FOR ELECTROLESS PLATING

BACKGROUND OF THE INVENTION

This invention relates to a pre-treating solution for electroless plating functioning as adhesion accelerating agent, particularly used for producing printed wiring boards.

Printed wiring boards are produced in the order of drilling of holes in a copper-clad laminate or a laminate having no copper thereon, electroless plating, pattern formation, removal of resist, etc.

Pretreatment step for electroless plating comprises conducting degreasing and washing of a substrate after drilling holes, softly etching copper surface on the substrate, washing with dilute sulfuric acid, dipping in a sensitizer containing palladium chloride/stannous chloride, etc., removing metallic impurities such as an α-stannic acid ($H_2SnO_3$) layer attached to a substrate surface and inner walls of holes with an adhesion accelerating agent, and depositing copper using an electroless copper plating solution. As the adhesion accelerating agent, there have been used an aqueous solution containing hydrochloric acid, or an aqueous solution containing hydrochloric acid and oxalic acid (Japanese Patent Examined Publication (JP-B) No. 53-34103), an aqueous solution containing borofluoric acid, and an aqueous solution containing sodium hydroxide and ethylene-diaminetetraacetic acid (EDTA) (Japanese Patent Unexamined Publication (JP-A) No. 51-8127).

But these adhesion accelerating agents have various problems. For example, in the case of using the adhesion accelerating agent containing borofluoric acid as a major component, when a pattern is formed using an alkaline ammonium etchant solution according to a pattern plating method, wedge type etching corrosion takes place at the boundary between a copper foil on the substrate and plated copper, resulting in causing a problem in reliability on electrical properties. Further, there is also a defect in that adhesiveness of plated copper to glass cloth portions is poor. As a result, there is a problem of a high generating rate of blow holes in the solder pick-up test.

In the case of the adhesion accelerating agent of JP-B 53-34103, there are problems in that a usable range of concentration of copper dissolved from a substrate copper is narrow, the life of solution is short, and when standing time in air becomes 15 seconds or longer, rust is easily produced on the substrate copper surface. As a result, surface roughness of plating after electroless plating takes place.

In the case of the adhesion accelerating agent of JP-A 51-8127, there is a problem in that a plated layer is easily peeled off from the substrate copper foil.

SUMMARY OF THE INVENTION

It is an object of the present invention to provide a pre-treating solution functioning as an adhesion accelerating agent which brings about no etching corrosion, has a long life and can provide excellent adhesiveness of plated copper to both glass cloth and substrate rerins.

The present invention provides a pretreating solution for electroless plating functioning as an adhesion accelerating agent comprising sulfuric acid, a halide, an organic acid and water as a diluent.

DESCRIPTION OF THE PREFERRED EMBODIMENTS

The pre-treating solution of the present invention contains sulfuric acid in a concentration of preferably in the range of 0.70 to 2.50 mole/l. When the concentration is too low, adhesiveness of the plated copper to the underlying copper becomes poor. On the other hand, when the concentration is too high, adhesiveness to a resin layer in a hole becomes poor.

As the halide, there can be used chlorides, bromide, etc. Examples of the halide are inorganic compounds such as sodium chloride, potassium chloride, sodium bromide, potassium bromide, etc. The concentration of halide is preferably in the range of 0.01 to 6.0 mole/l. When the concentration is too low, adhesiveness of the plated copper to the underlying copper becomes poor. On the other hand, when the concentration is too high, there takes place surface roughness of plating.

As the organic acid, there can be used aliphatic carboxylic acids having carboxyl group(s) and aromatic carboxylic acids. Examples of the aliphatic carboxylic acids are lactic acid, tartaric acid, citric acid, oxalic acid, succinic acid, acetic acid, formic acid, malic acid, etc. Examples of the aromatic carboxylic acids are benzoic acid, phthalic acid, etc. The concentration of organic acid is preferably in the range of 0.005 to 1.0 mole/l. When the concentration is too low, adhesiveness of the plated copper to the underlying copper becomes poor and deposition of plating on glass cloth is lowered. On the other hand, when the concentration is too high, the dissolution of substrate copper is accelerated to shorten the life of the pre-treating solution.

The halide and the organic acids mentioned above can be used singly or as a mixture thereof, respectively.

The pre-treating solution functioning as an adhesion accelerating agent can be used, for example, in the production of printed wiring boards as follows.

After drilling holes in predetermined portions in a copper-clad laminate used as a substrate, the substrate is subjected to conditioning with a cleaner, washing with water, soft etching, washing with water, washing with an acid, washing with water, predipping, treatment with a sensitizer, washing with water, pore-treatment using the adhesion accelerating agent of the present invention, washing with water, and treatment with an electroless copper plating solution. After electroless copper plating, the resulting substrate is subjected to an electric copper plating step, a laminating step, a baking and exposure step, an etching step and a resist removing step to obtain a printed wiring board.

When the pre-treating solution of the present invention is used, there can be obtained various excellent effects in that fundamental properties at the step of electroless copper plating are maintained or improved, and particularly in the production of printed wiring boards, the phenomenon of surface roughness and etching corrosion can be prevented, and generation of blow holes is reduced.

Such effects are obtained by using the adhesion accelerating agent of the present invention. Detailed mechanism of such effects caused by the adhesion accelerating agent are unclear, but the following reasons are presumed.

When electroless plating is to be carried out, it is necessary to adhere palladium as an initiator for plating reaction to a surface of a material (or substrate) to be plated prior to plating. This step is called as a sensitizing step, wherein excess amounts of stannous chloride and hydrochloric acid are added to palladium chloride as shown below:

$$PdCl_2 + SnCl_2 + 9H_2O + HCl \longrightarrow Pd^0 + H_2SnO_3 \cdot 6H_2O + 5HCl$$

(α-stannic acid)

The metallic palladium produced by this reaction seems to be dispersed as a protective colloid for α-stannic acid. This protective colloid layer for α-stannic acid should be removed so as to expose activated palladium on the surface.

In order to remove the α-stannic acid layer, it becomes important to select a suitable complexing agent for α-stannic acid.

The sulfuric acid which is a main component in the pre-treating solution of the present invention is weak as a complexing agent for α-stannic acid compared with known inorganic acids such as hydrochloric acid, borofluoric acid, etc. But, when hydrochloric aid is used, there arises a problem of causing surface roughness of plating, and when borofluoric acid is used, there are problems of lowering of plating properties on glass cloth and disposal of waste solution. Therefore, the use of sulfuric acid as a complexing agent is noticed.

After earnest study, it was found that addition of a special halide and an organic acid having carboxyl group(s) as a functional group to sulfuric acid was effective. The complexing ability of halide for α-stannic acid were effective in the following order:

fluorides>chlorides>bromides>iodides

But the fluorides had problems in lowering in plating properties and disposal of waste solution, and the iodides had problems in suppressing or stopping of the reaction of electroless plating in the later step. Therefore, chlorides and bromides were retained as a practically usable complexing agent.

According to the present invention, by using a special halide such as a chloride or bromide preferably in a special concentration range, and using an organic acid having at least one carboxyl group as a functional group, a-stannic acid can be removed completely by synergistic effect in combination with sulfuric acid. As a result, fundamental properties in the electroless plating step can be maintained or improved. Particularly in the production of printed wiring boards, by using the pre-treating solution of the present invention, the surface roughness of plating and etching corrosion can be prevented.

The present invention is illustrated by way of the following Examples.

EXAMPLE 1

After surface polishing, a double-sided copper-clad laminate (FR-4, a trade name, mfd. by Hitachi Chemical Co., Ltd.; 50 mm wide, 100 mm long, 1.6 mm thick, having holes of 1.0 mm in diameter) used as a substrate was dipped in Cleaner Conditioner CLC 401 (a trade name, mfd. by Hitachi Chemical Co., Ltd.) for degreasing and conditioning treatment. After washing with water, soft etching was carried out by dipping the thus treated laminate in 200 g/l of ammonium persulfate, followed by washing with 10% $H_2SO_4$, treatment in dipping in 250 g/l of Pre-dip Solution PD-201 (a trade name, mfd. by Hitachi Chemical Co., Ltd.) and treatment in dipping in a sensitizer HS 202B (a trade name, mfd. by Hitachi Chemical Co., Ltd.). Then, the resulting substrate was dipped in an adhesion accelerating agent comprising 1.5 mole/l of sulfuric acid, 0.1 mole/l of sodium bromide, 1.0 mole/l of oxalic acid and water as a diluent at room temperature for 5 minutes. Then, electroless copper plating was carried out using CUST-201 (a trade name, mfd. by Hitachi Chemical Co., Ltd.) for 20 minutes, and subjected to the following tests.

(1) Surface change and surface roughness of plating

After dipping in the adhesion accelerating solution, a substrate was allowed to stand in the air for 10 seconds, 20 seconds, 40 seconds or 60 seconds and observed changes of surface appearance of the substrate, while the presence of surface roughness after electric plating (3 A/dm²×60 min.) was also examined.

Evaluation:
○: no change with no rust generation
Δ: Slightly changed or slightly rusted
X: Changed into a violet yellow color or generation of rust (2) Adhesiveness of plated copper Covering properties according to electroless copper plating were evaluated by a back light test.

Evaluation:
A: No transmission
B: Transmission of 10% or less
C: Transmission of more than 10%

(3) Etching corrosion

After the electroless copper plating, a copper sulfate plating was carried out, followed by baking using a dry film having a pattern with 10 μm line width and development for pattern formation with an alkali etchant. The presence of etching corrosion at the boundary portion between the substrate and the plated copper was examined using a micro section.

(4) Adhesiveness

Adhesiveness between the substrate copper foil and the plated copper was judged by adsorbing coercively synthesized α-stannic acid on a substrate surface by dipping after the sensitizing step, dipping the resulting substrate in the adhesive accelerating agent, carring out electroless copper plating, carrying out copper sulfate plating, and subjecting to a peeling test. The peeling test was carried out by cutting a corner portion of plated copper film of a sample with a knife blade, inserting a blade top between the plated copper film and the substrate copper foil to turn over a part of the plated copper, and peeling the plated copper from the turned over portion. When adhesiveness is strong, the plated copper was not peeled, while when adhesiveness to weak, the plated copper was peeled.

EXAMPLE 2

The process of Example 1 was repeated except for using as the adhesion accelerating agent the following aqueous solution containing:

| | |
|---|---|
| sulfuric acid | 1.5 mole/l |
| sodium chloride | 0.2 mole/l |
| citric acid | 0.5 mole/l |

EXAMPLE 3

The process of Example 1 was repeated except for using as the adhesion accelerating agent the following aqueous solution containing:

| | |
|---|---|
| sulfuric acid | 0.7 mole/l |
| sodium chloride | 0.01 mole/l |
| phthalic acid | 0.01 mole/l |

EXAMPLE 4

The process of Example 1 was repeated except for using as the adhesion accelerating agent the following aqueous solution containing:

| sulfuric acid | 2.50 mole/l |
| --- | --- |
| potassium bromide | 6.0 mole/l |
| tartaric acid | 1.0 mole/l |

COMPARATIVE EXAMPLE 1

The process of Example 1 was repeated except for using as the adhesion accelerating agent the following aqueous solution containing:

| borofluoric acid | 0.3 mole/l |
| --- | --- |

COMPARATIVE EXAMPLE 2

The process of Example 1 was repeated except for using as the adhesion accelerating agent the following aqueous solution containing:

| hydrochloric acid | 1.2 mole/l |
| --- | --- |
| oxalic acid | 0.1 mole/l |

COMPARATIVE EXAMPLE 3

The process of Example 1 was repeated except for using as the adhesion accelerating agent the following aqueous solution containing:

| sodium hydroxide | 2 mole/l |
| --- | --- |
| EDTA | 0.3 mole/l |

COMPARATIVE EXAMPLE 4

The process of Example 1 was repeated except for using as the adhesion accelerating agent the following aqueous solution containing:

| sulfuric acid | 1.5 mole/l |
| --- | --- |
| sodium bromide | 0.1 mole/l |

COMPARATIVE EXAMPLE 5

The process of Example 1 was repeated except for using as the adhesion accelerating agent the following aqueous solution containing:

| sulfuric acid | 1.5 mole/l |
| --- | --- |
| citric acid | 1.0 mole/l |

COMPARATIVE EXAMPLE 6

The process of Example 1 was repeated except for using as the adhesion accelerating agent the following aqueous solution containing:

| sodium bromide | 0.1 mole/l |
| --- | --- |
| oxalic acid | 1.0 mole/l |

The test results are shown in Table 1.

TABLE 1

| Example No. | Surface change/Surface roughness | | | | Adhesiveness of plated copper (back light) | Etching corrosion | Adhesiveness |
| --- | --- | --- | --- | --- | --- | --- | --- |
| | 10 sec | 20 sec | 40 sec | 60 sec | | | |
| Example 1 | o/None | o/None | o/None | o/None | A | No | No peeling |
| Example 2 | o/None | o/None | o/None | o/None | A | No | No peeling |
| Example 3 | o/None | o/None | o/None | o/None | A | No | No peeling |
| Example 4 | o/None | o/None | o/None | o/None | A | No | No peeling |
| Comparative Example 1 | o/None | o/None | o/None | o/None | C | Yes | No peeling |
| Comparative Example 2 | o/None | Δ/None | x/Yes | x/Yes | B | No | No peeling |
| Comparative Example 3 | o/None | o/None | o/None | o/None | B | Yes | Peeled |
| Comparative Example 4 | o/None | o/None | o/None | o/None | A | No | Peeled |
| Comparative Example 5 | o/None | o/None | o/None | o/None | A | No | Peeled |
| Comparative Example 6 | o/None | o/None | o/None | o/None | A | No | Peeled |

As explained above, the pre-treating solution for electroless plating of the present invention, is not corrosive and has a long life, and can be used for producing printed wire boards with high quality due to providing excellent adhesiveness of plated copper to both glass cloth and substrate resin without generating etching corrosion.

What is claimed is:

1. A pre-treating solution for electroless plating comprising sulfuric acid, a halide, an organic acid which is an aromatic carboxylic acid and water as a diluent wherein the sulfuric acid is contained in an amount of 0.70 to 2.50 mole/l, the halide is contained in an amount of 0.01 to 6.0 mole/l and the organic acid is contained in an amount of 0.005 to 1.5 mole/l and the aromatic carboxylic acid is benzoic acid or phthalic acid.

2. A pre-treating solution according to claim 1, wherein the halide is a chloride or bromide.

* * * * *